(12) United States Patent
Cousins et al.

(10) Patent No.: US 8,883,247 B2
(45) Date of Patent: Nov. 11, 2014

(54) ARRAY OF SMALL CONTACTS FOR SOLAR CELL FABRICATION

(75) Inventors: Peter John Cousins, Menlo Park, CA (US); Michael Joseph Cudzinovic, Sunnyvale, CA (US)

(73) Assignee: SunPower Corporation, San Jose, CA (US)

( * ) Notice: Subject to any disclaimer, the term of this patent is extended or adjusted under 35 U.S.C. 154(b) by 148 days.

(21) Appl. No.: 12/949,523

(22) Filed: Nov. 18, 2010

(65) Prior Publication Data

US 2011/0061731 A1    Mar. 17, 2011

Related U.S. Application Data

(63) Continuation of application No. 11/807,567, filed on May 29, 2007, now Pat. No. 7,838,062.

(51) Int. Cl.
| | | |
|---|---|---|
| *B05D 7/00* | (2006.01) | |
| *H01L 31/0224* | (2006.01) | |
| *H01L 21/768* | (2006.01) | |
| *H01L 31/068* | (2012.01) | |
| *H01L 21/033* | (2006.01) | |
| *H01L 21/311* | (2006.01) | |

(52) U.S. Cl.
CPC .. *H01L 31/022425* (2013.01); *H01L 21/76802* (2013.01); *H01L 31/022441* (2013.01); *H01L 31/0682* (2013.01); *H01L 21/0337* (2013.01); *H01L 21/31144* (2013.01); *Y02E 10/547* (2013.01)
USPC ............................................................ 427/74

(58) Field of Classification Search
USPC ............................................................ 427/74
See application file for complete search history.

(56) References Cited

U.S. PATENT DOCUMENTS

| | | | |
|---|---|---|---|
| 6,145,960 A | 11/2000 | Kanda et al. | |
| 6,387,726 B1 | 5/2002 | Verlinden et al. | |
| 6,423,568 B1* | 7/2002 | Verlinden et al. | 438/98 |
| 6,872,321 B2* | 3/2005 | Thavarajah et al. | 216/40 |
| 6,998,288 B1* | 2/2006 | Smith et al. | 438/48 |
| 2001/0040290 A1 | 11/2001 | Sakurai et al. | |
| 2005/0090029 A1 | 4/2005 | Yamazaki et al. | |

FOREIGN PATENT DOCUMENTS

| | | |
|---|---|---|
| JP | H11-138787 | 5/1999 |
| JP | 2001-189482 | 10/2001 |
| JP | 2002-158248 | 5/2002 |
| JP | 2003-298078 | 10/2003 |
| JP | 2006-124805 | 5/2006 |
| JP | 2006-261089 | 9/2006 |
| JP | 2007-125855 | 5/2007 |
| WO | 03/083955 A1 | 10/2003 |

\* cited by examiner

*Primary Examiner* — Robert Vetere
(74) *Attorney, Agent, or Firm* — Okamoto & Benedicto LLP

(57) ABSTRACT

Fabrication of a solar cell using a printed contact mask. The contact mask may include dots formed by inkjet printing. The dots may be formed in openings between dielectric layers (e.g., polyimide). Intersections of overlapping dots may form gaps that define contact regions. The spacing of the gaps may be dictated by the alignment of nozzles that dispense the dots. Using the dots as a contact mask, an underlying dielectric layer may be etched to form the contact regions through the underlying dielectric layer. Metal contact fingers may be formed over the wafer to form electrical connections to corresponding diffusion regions through the contact regions.

14 Claims, 4 Drawing Sheets

ARRAY OF SMALL CONTACTS FOR SOLAR CELL FABRICATION

CROSS-REFERENCE TO RELATED APPLICATION

This application is a continuation of U.S. application Ser. No. 11/807,567, now U.S. Pat. No. 7,838,062, filed on May 29, 2007, which is incorporated herein by reference in its entirety.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. They may be fabricated on a semiconductor wafer using semiconductor processing technology. Generally speaking, a solar cell may be fabricated by forming P-type and N-type diffusion regions in a silicon substrate. Solar radiation impinging on the solar cell creates electrons and holes that migrate to the diffusion regions, thereby creating voltage differentials between the diffusion regions. In a backside junction solar cell, both the diffusion regions and the metal contact fingers coupled to them are on the backside of the solar cell. The contact fingers allow an external electrical circuit to be coupled to and be powered by the solar cell.

For cost reasons, inkjet printing steps have been developed for use in back end processes involving electrical connection of a metal contact finger to a corresponding diffusion region. More specifically, a contact mask defining a contact hole through which a metal contact finger may be electrically connected to a diffusion region may be formed by inkjet printing. However, the contact mask typically requires critical alignment with other features of the solar cell wafer. This alignment limits the processing parameters of other steps in the back end process.

SUMMARY

In one embodiment, a contact mask for use in fabrication of solar cells may comprise dots formed by inkjet printing. The dots may be formed in openings between dielectric layers (e.g., polyimide). Intersections of overlapping dots may form gaps that define contact regions. The spacing of the gaps may be dictated by the alignment of nozzles that dispense the dots. Using the dots as a contact mask, an underlying dielectric layer may be etched to form the contact regions through the underlying dielectric layer. Metal contact fingers may be formed over the wafer to form electrical connections to corresponding diffusion regions through the contact regions.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, structures, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
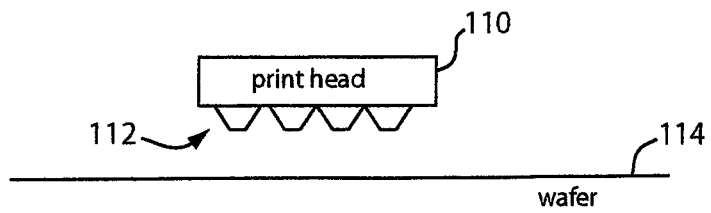
FIG. 1 schematically shows an example inkjet printer that may be used in embodiments of the present invention.

FIG. 1 schematically shows an example inkjet printer that may be used in embodiments of the present invention. In the example of FIG. 1, the inkjet printer includes a printhead 110 and a plurality of nozzles 112. The nozzles 112 may be arranged in rows and columns to form an array. The use of inkjet printers in semiconductor processing, in general, is well known. Briefly, material is flowed through the nozzles 112 and onto a wafer 114. One or more passes of the printhead 110 over the wafer 114 results in a pattern being printed on the wafer 114. In the following embodiments, this pattern may be a mask for forming metal contact regions in a solar cell.

Figure 2:
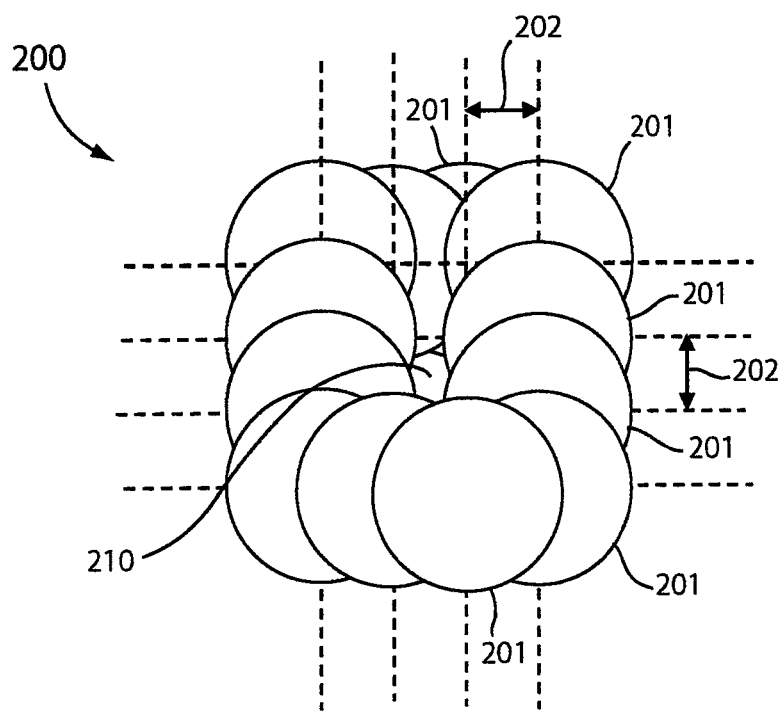
FIG. 2 schematically shows one way of forming a contact mask on a wafer by inkjet printing.

FIG. 2 schematically shows one way of forming a contact mask 200 on the wafer 114 by inkjet printing. In the example of FIG. 2, the contact mask 200 comprises a plurality of dots 201 defining an aperture 210. Not all of the dots 201 have been labeled in FIG. 2 for clarity of illustration. The aperture 210, which defines a region through which a metal contact will be formed, is formed by missing dots 201. That is, the aperture 210 is formed by printing the dots 201 to miss the area of the aperture 210. Using an inkjet printer with relatively high dots per inch (DPI), a dot diameter of about 100 µm, a distance 202 of about 31.75 µm between centers of consecutive dots 201, an aperture 210 may define a contact region having a diameter of about 30 µm. Although the mask 200 is sufficient for most solar cell applications, it is relatively difficult and process window limiting to align the aperture 210 relative to other features of the wafer 114. This is especially true as the aperture 210 is made smaller.

FIG. 3, which consists of FIGS. 3A-3D, shows cross-sections schematically illustrating a solar cell fabrication process in accordance with an embodiment of the present invention. The process of FIG. 3 pertains to the formation of a contact mask for forming metal contact fingers of the solar cell. Processing details not necessary to the understanding of the invention have been omitted in the interest of clarity.

Figure 3A:
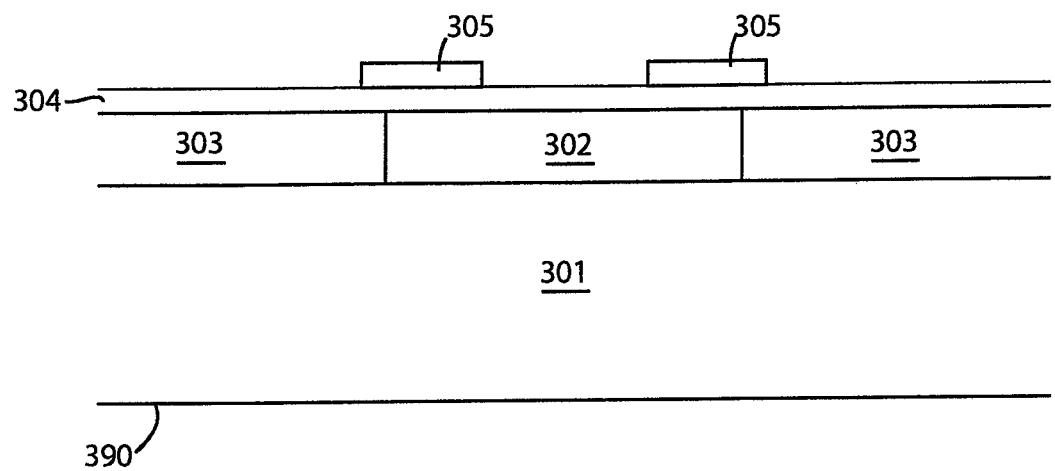
FIG. 3, which consists of FIGS. 3A-3D, shows cross-sections schematically illustrating a solar cell fabrication process in accordance with an embodiment of the present invention.

Referring to FIG. 3A, the solar cell includes a substrate in the form of a wafer 301 and a plurality of diffusion regions 303 and 302. The diffusion regions 303 and 302 may be formed in the wafer 301 or an overlying layer. In the example of FIG. 3, a diffusion region 303 comprises a P-type diffusion region and a diffusion region 302 comprises an N-type diffusion region. There are several diffusion regions 303 and 302 for any given solar cell wafer in accordance with embodiments of the present invention. The solar cell of FIG. 3A comprises a backside junction solar cell in that the diffusion regions 303 and 302 are on the backside, which is opposite to a front side 390. The front side 390 faces the sun during normal operation.

A dielectric layer 304 is formed over the diffusion regions. In one embodiment, the dielectric layer 304 comprises silicon dioxide formed to a thickness of about 1000-6000 Angstroms by atmospheric pressure chemical vapor deposition (APCVD). The layer 304 provides electrical insulation between the diffusion regions and overlying electrically conductive layers, such as subsequently formed metal contact fingers.

Dielectric layers 305 are formed over the dielectric layer 304 to advantageously prevent a metal contact finger of one polarity from electrically shorting to a diffusion region of another polarity. In the example of FIG. 3, the layers 305 prevent metal contact fingers electrically connected to an N-type diffusion region 302 (i.e., N-type metal contact fingers) from electrically shorting to a P-type diffusion region 303. In one embodiment, the dielectric layers 305 comprise polyimide screen printed to a thickness of about 5 microns. The dielectric layer 305 may be formed using other deposition techniques. However, the dielectric layer 305 is preferably screen printed for cost saving, which is especially important in solar cell applications. In one embodiment, the openings between layers 305 are about 200 μm.

Figure 3B:
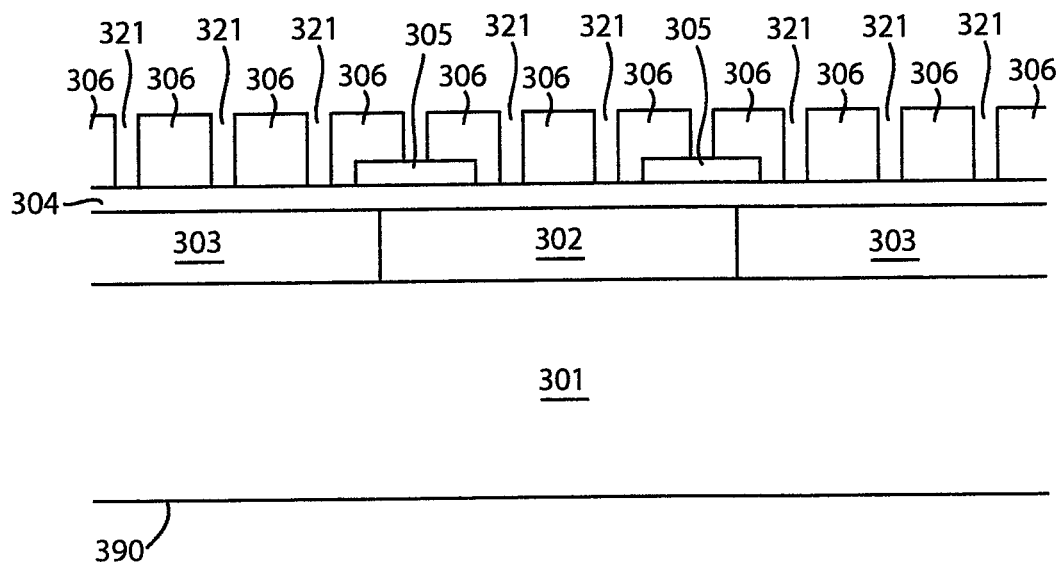

In FIG. 3B, a plurality of dots 306 are inkjet printed over the wafer 301. As can be appreciated, the dots 306 are so named to indicate that they are formed by discharging material through a nozzle; the dots 306 are not necessarily circular. The dots 306 may be inkjet printed over the wafer 301 such that a gap 321 is formed between dots 306. As will be more apparent below, the gaps 321 define contact regions through which metal contact fingers may electrically connect to corresponding diffusion regions. The dots 306 may be formed in a single pass of the printhead over the wafer 301 to result in the gaps 321 being formed in openings between layers 305. The dots 306, which form the contact mask 400 of FIG. 4, may comprise a hot-melt resin.

Figure 4:
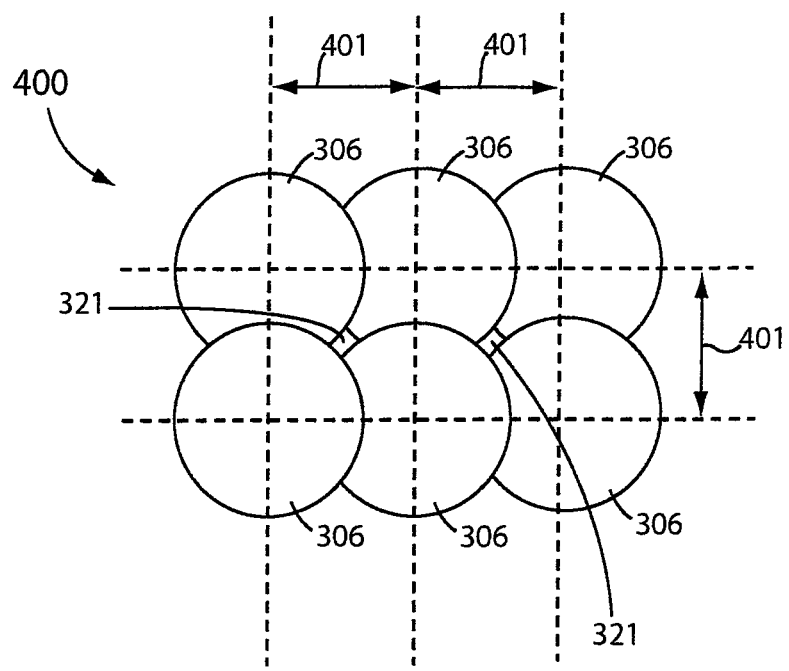
FIG. 4 shows a top view illustrating the positional relationship between a gap and adjacent dots in accordance with an embodiment of the present invention.

FIG. 4 shows a top view illustrating the positional relationship between a gap 321 and adjacent dots 306 in accordance with an embodiment of the present invention. In the example of FIG. 4, the contact mask 400 comprises a plurality of overlapping dots 306 inkjet printed to form the gaps 321. A gap 321 is an area on which a dot 306 is not printed. As shown in FIG. 4, each gap 321 may be formed by intersections of a plurality (e.g., four) overlapping dots 306. Advantageously, the size and location of the gaps 321 may be defined and dictated by the physical alignment of the nozzles that dispense the dots 306. For example, the dimension 401 between centers of dots 306 may be defined by the pitch of the inkjet nozzles. As a result, the spacing between the gaps is also dictated by the physical alignment of the nozzles that dispense the dots.

The contact mask 400 provides several advantages heretofore unrealized. Because the accuracy of the spacing between dots 306 is dictated by the physical alignment of the nozzles, an inkjet printer with relatively low DPI may be used to define a plurality of gaps 321. For example, given a dot diameter of about 100 μm, +/−5 μm, the distance 401 between centers of the dots may be as long as 75 μm, with each gap 321 having a diameter of about 6 μm. Preferably, the size of each gap is made as small as possible to minimize coverage, and thus the probability of a gap aligning with a pinhole in a layer 305. For similar reasons, the gaps 321 are also preferably formed only in openings between layers 305.

The contact mask 400 is also "alignment-free" in that it may be printed without critical alignment over the wafer 301. This is because the gaps 321 do not have to be formed in a particular location between the layers 305; the gaps 321 only have to be formed between the layers 305. Also, to print the contact mask 400, the inkjet printer simply has to pass over the wafer 301, without having to make an intricate pattern such as that of the contact mask 200 of FIG. 2. The contact mask 400 may be printed in one or multiple passes along a relatively straight path. In one embodiment, the contact mask 400 is inkjet printed in one pass in one direction.

Figure 3C:
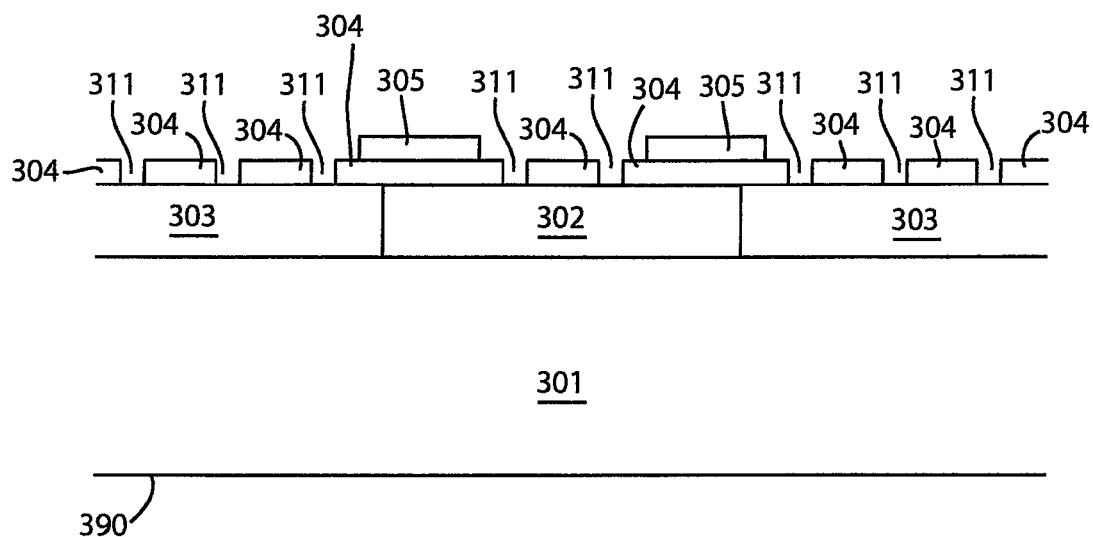

Continuing to FIG. 3C, the contact mask 400 is employed to remove portions of the layer 304 to form the contact regions 311 therethrough. In one embodiment, the contact regions 311 are formed by etching the layer 304 using the contact mask 400 as an etch mask and with an etchant that will not appreciably etch the layers 305. For example, with a layer 304 comprising silicon dioxide and layers 305 comprising polyimide, the contact regions 311 may be formed by wet etching exposed portions (i.e., those directly under gaps 321) of the layer 304 in a buffered oxide etch (BOE) process using hydrofluoric acid (HF) as an etchant. The layers 305 serve as an etch stop in that etch process. FIG. 3C depicts the sample of FIG. 3B after the BOE process and subsequent removal of the contact mask 400. A contact mask 400 comprising a hot-melt resin may be removed in a mask strip process using potassium hydroxide (KOH).

As shown in FIG. 3C, the contact mask 400 resulted in a plurality of contact regions 311 in openings between layers 305. The contact regions 311 are relatively small due to the small size of corresponding gaps 321 used to define the contact regions 311. This results in a plurality of relatively small contact regions 311 through which metal contact fingers may form electrical connections to corresponding diffusion regions. The relatively small size of the contact regions 311 (e.g., 6 μm for the same size gap 321) allows for relatively small metal contact fingers, which in turn advantageously allows for higher efficiency.

Figure 3D:
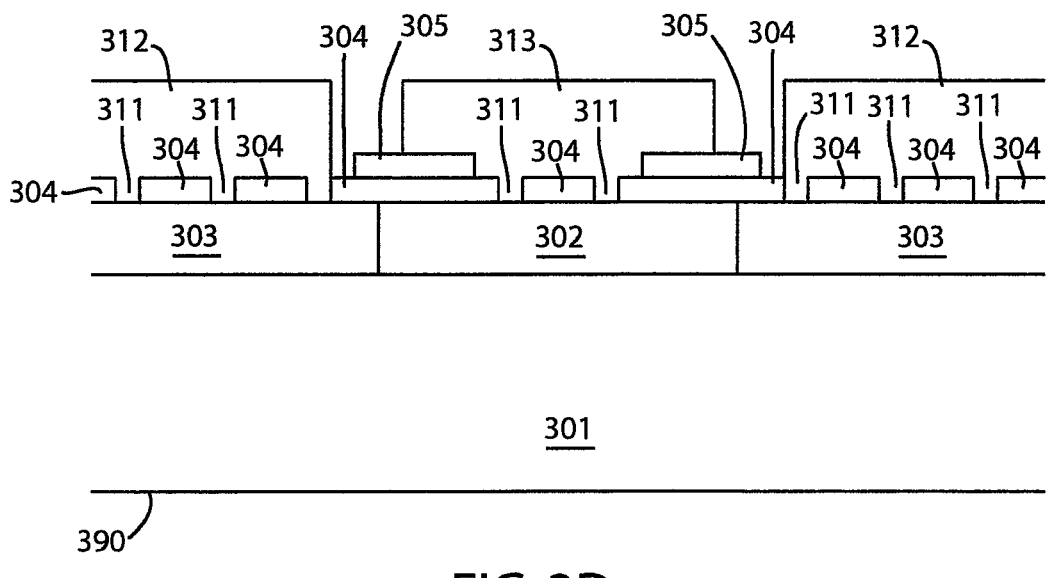

In FIG. 3D, metal contact fingers 312 and 313 are formed through the contact regions 311. In one embodiment, the metal contact fingers 312 and 313 comprise a stack of materials comprising 1000 Angstrom thick aluminum layer, which is over a 500 Angstrom-thick titanium-tungsten layer, which is over a 300 microns-thick copper layer, which is over a 6 microns-thick tin layer. Other metals and metal structures may also be used without detracting from the merits of the present invention. There are several metal contact fingers 312 and 313 for any given solar cell wafer in accordance with embodiments of the present invention. In the example of FIG. 3D, a metal contact finger 312 is a P-type metal contact finger as it is electrically connected to a P-type diffusion region 303 through a contact region 311. Likewise, a metal contact finger 313 is an N-type metal contact finger as it is electrically connected to an N-type diffusion region 302 through a contact region 311. An external electrical circuit may be electrically connected to the metal contact fingers to receive power from the solar cell.

Figure 5:
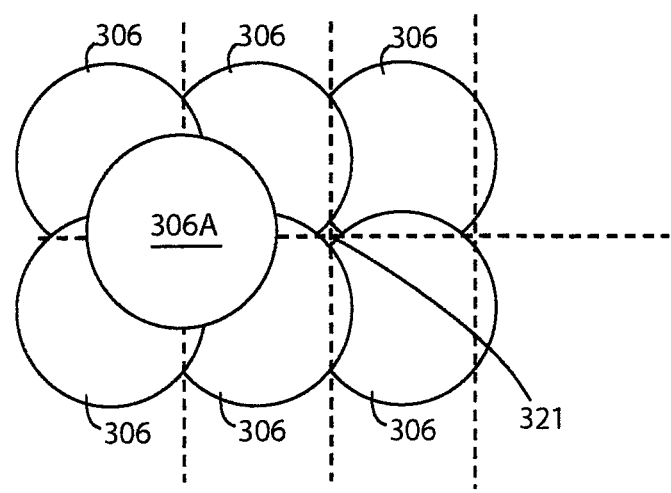
FIG. 5 schematically shows a top view illustrating a contact mask formed by multiple printing passes, in accordance with an embodiment of the present invention.

The dots 306 in FIG. 4 may be printed in one pass of the printhead over the wafer. Two or more passes over the wafer may also be performed to, for example, cover certain gaps 321. In the example of FIG. 5, a first pass of the printhead formed the contact mask 400 as shown in FIG. 4, and a second pass of the printhead formed the dot 306A to cover a gap 321 (under the dot 306A).

A novel array of small contacts for solar cell fabrication has been disclosed. While specific embodiments of the present invention have been provided, it is to be understood that these embodiments are for illustration purposes and not limiting.

Many additional embodiments will be apparent to persons of ordinary skill in the art reading this disclosure.

What is claimed is:

1. A method of fabricating a solar cell, the method comprising:
    forming a dielectric layer over a wafer to be processed into a solar cell; and
    inkjet printing a plurality of dots over the dielectric layer to form a plurality of gaps, each gap in the plurality of gaps being an area where no dot of the plurality of dots is printed, and wherein an entire perimeter of each of the gaps is surrounded with overlapping dots of the plurality of dots.

2. The method of claim 1, further comprising:
    removing portions of the dielectric layer to form a plurality of contact regions through the dielectric layer and onto diffusion regions of the solar cell, a location of a contact region in the plurality of contact regions being defined by a gap in the plurality of gaps.

3. The method of claim 2, further comprising:
    forming metal contact fingers over the dielectric layer to create electrical connections to the diffusion regions by way of the plurality of contact regions.

4. The method of claim 3, wherein the at least some of the metal contact fingers comprise N-type metal contact fingers formed to create electrical connections to corresponding N-type diffusion regions, and at least some of the metal contact fingers comprise P-type metal contact fingers formed to create electrical connections to corresponding P-type diffusion regions, the P-type and N-type diffusion regions being formed on a backside of the wafer, which is opposite a front side of the wafer facing the sun during normal operation.

5. The method of claim 1, wherein the plurality of dots is printed in one pass of a printhead in one direction over the wafer.

6. The method of claim 5, further comprising:
    passing the printhead over the wafer at least in another pass to print another dot covering a gap in the plurality of gaps.

7. The method of claim 1, further comprising forming contact regions through the dielectric layer to expose N-type and P-type diffusion regions on a backside of the solar cell, the backside being opposite a front side of the wafer facing the sun during normal operation.

8. The method of claim 1, wherein the dielectric layer comprises silicon dioxide.

9. A method of fabricating a solar cell, the method comprising:
    forming a dielectric layer over a solar cell wafer; and
    printing a plurality of dots to form a contact mask that comprises a plurality of gaps, wherein said printing includes surrounding an entire perimeter of each of the gaps with continuously overlapping dots of the plurality of dots.

10. The method of claim 9, further comprising:
    etching portions of the dielectric layer that are exposed through the gaps to form a plurality of contact regions that exposes a plurality of diffusion regions of the solar cell.

11. The method of claim 10, further comprising:
    removing the plurality of dots from the wafer; and
    forming metal contact fingers in the plurality of contact regions to electrically connect to corresponding diffusion regions in the plurality of diffusion regions.

12. The method of claim 11, wherein some of the metal contact fingers comprise N-type metal contact fingers electrically connected to N-type diffusion regions in the plurality of diffusion regions on a backside of the solar cell and some of the metal contact fingers comprise P-type metal contact fingers electrically connected to P-type diffusion regions in the plurality of diffusion regions on the backside of the solar cell.

13. The method of claim 9, wherein the plurality of dots are printed using an inkjet printer.

14. The method of claim 9, wherein the dielectric layer comprises silicon dioxide.

* * * * *